(12) United States Patent
Nakano et al.

(10) Patent No.: US 7,242,087 B2
(45) Date of Patent: Jul. 10, 2007

(54) FLEXIBLE PRINTED CIRCUIT BOARD

(75) Inventors: Akira Nakano, Miyagi-ken (JP); Yoshiomi Tsuji, Miyagi-ken (JP); Yoshinari Higa, Tokyo (JP)

(73) Assignee: Alps Electric Co., Ltd., Ota-Ku, Tokyo (JP)

( * ) Notice: Subject to any disclaimer, the term of this patent is extended or adjusted under 35 U.S.C. 154(b) by 70 days.

(21) Appl. No.: 11/058,810

(22) Filed: Feb. 15, 2005

(65) Prior Publication Data

US 2005/0189645 A1   Sep. 1, 2005

(30) Foreign Application Priority Data

Feb. 26, 2004   (JP)   ............................ 2004-051868

(51) Int. Cl.
   *H01L 23/12*   (2006.01)
(52) U.S. Cl. .................. 257/701; 257/725; 257/516; 257/E27.113; 257/E27.114
(58) Field of Classification Search ................ 257/724, 257/516, E27.113, E27.114, 701; 174/254, 174/255
See application file for complete search history.

(56) References Cited

U.S. PATENT DOCUMENTS

| 4,775,573 A | * | 10/1988 | Turek ........................ 428/209 |
| 6,339,200 B1 | | 1/2002 | Shi et al. |
| 6,727,564 B2 | * | 4/2004 | Shinomiya .................. 257/432 |

FOREIGN PATENT DOCUMENTS

JP   8-17027   1/1996

\* cited by examiner

*Primary Examiner*—Long K. Tran
(74) *Attorney, Agent, or Firm*—Beyer Weaver LLP

(57) ABSTRACT

A flexible printed circuit board includes a substrate layer composed of insulating material, a protection circuit of a thin-film capacitor element, the protection circuit including a first wiring layer on the substrate layer, a dielectric layer, and a counter electrode layer. At least a portion of each of the first wiring layer and the counter electrode layer serves as a terminal. The front surface of each of the first wiring layer and the counter electrode layer, except the terminal portion, is covered with an insulating coating.

4 Claims, 2 Drawing Sheets

FLEXIBLE PRINTED CIRCUIT BOARD

BACKGROUND OF THE INVENTION

1. Field of the Invention

The present invention relates to antistatic flexible printed circuit (FPC) boards that do not cause electrostatic damage to electrical components connected to the FPC boards.

2. Description of the Related Art

Hard disk drives are often used in, for example, magnetic recording devices for computers and video recording/playback devices. A hard disk drive includes a rotatable disk including a magnetic recording layer. In a hard disk drive, a magnetic head attached to a tip of a metallic leaf spring called a load beam moves relative to the disk surface to write and read data magnetically.

The magnetic head, including a micro-magnetic circuit, for example, a giant magnetoresistive (GMR) element, is mounted on a moving ceramic part called a slider. While the leaf spring urges the bottom surface of the slider toward the disk surface, wind pressure caused by the spinning of the disk is applied to the slider. Thus, the slider floats and moves relative to the disk surface in a contact start/stop (CSS) mode so that the magnetic head can magnetically write and read data.

Since the slider provided with the magnetic head is attached to the tip of the leaf spring, a wiring line extends from the micro-magnetic circuit in the magnetic head to the base of the leaf spring through an FPC board to connect the micro-magnetic circuit to, for example, an electrical circuit and a drive control circuit in a main body of the hard disk drive. In some cases, an amplifying element, for example, a preamplifier that amplifies detection signals from the micro-magnetic circuit, is provided at some point in a connection path through the FPC board.

Thus, a hard disk drive includes many movable parts such as a drive mechanism rotating a disk and a slider moving in a CSS mode. The hard disk drive further includes a resin FPC board. In this situation, static electricity is easily generated. Since the magnetic head includes, for example, a GMR element serving as a micro-magnetic circuit as described above, the magnetic head is highly sensitive to static electricity. Thus, static electricity easily causes damage to the magnetic head. For example, static electricity is built up in a hard disk drive when a worker touches the hard disk drive in the assembly operation, and the static electricity may cause damage to the GMR element or cause malfunction of the GMR element when the hard disk drive is used.

An FPC board serving as a wiring path is used not only for a slider provided with a magnetic head but also for an optical pickup in, for example, a compact disk (CD) drive and a digital versatile disk (DVD) drive. These drives also include many movable parts. Thus, malfunction and damage are easily caused by static electricity.

In view of the situation described above, the following antistatic method in magnetic read/write devices including magnetic heads is disclosed in Japanese Unexamined Patent Application Publication No. 8-17027. A read/write head carriage is connected to a read/write circuit with an FPC board serving as a wiring cable. In the FPC board, electrically insulating films covering surfaces of the FPC board are bonded to an electrical conductor connected to the read/write circuit with bonding layers. These bonding layers have electrical conductivity in order to supply electric charge having a polarity opposite to that built up on surfaces of the films.

Although the antistatic arrangement disclosed in the foregoing document is adopted, static electricity may be built up on surfaces of an FPC board, as long as the FPC board has a resin insulating body, when a worker or other components touch the FPC board in the assembly operation. In the assembly operation, before electric charge having a polarity opposite to that of the electric charge of the built-up static electricity is supplied to the FPC board to prevent the static electricity, the static electricity may have an adverse effect on a micro-magnetic circuit in a magnetic head and may have an adverse effect, for example, malfunction, on various elements, for example, a preamplifier provided at some point in a circuit, an optical pickup, and a laser chip.

Alternatively, a capacitor-resistor (CR) chip that is composed of a capacitor and a resistor and serves as a protection circuit may be additionally attached to an FPC board to solve the problem described above. When a dedicated chip serving as a protection circuit is additionally installed, the following problems occur. An additional step for mounting the CR chip is required. Also, in the FPC board, flexibility of a portion carrying the chip serving as a protection circuit is impaired. Although the FPC board needs to quickly move along with a magnetic head moving at high speed, such a magnetic head loses its balance when the FPC board is less flexible. Moreover, in the FPC board, additional space is required for mounting the CR chip in addition to the required elements, for example, the magnetic head and a laser chip.

SUMMARY OF THE INVENTION

In view of the problems described above, it is an object of the present invention to provide an FPC board including a built-in antistatic circuit. The FPC board does not cause electrostatic damage to an optical pickup element, a preamplifier element, and a magnetic head including a micro circuit, thereby improving the yield. The FPC board also eliminates limitations on the packaging of an optical pickup element, a preamplifier element, a magnetic head, and the like.

An FPC board according to a first aspect of the present invention includes a substrate layer composed of insulating material; a first wiring layer on the front surface of the substrate layer; a second wiring layer on the back surface of the substrate layer; at least one dielectric layer; and at least one counter electrode layer. A stack of a dielectric layer, a counter electrode layer, and the first wiring layer, and/or a stack of a dielectric layer, a counter electrode layer, and the second wiring layer defines a protection circuit of a thin-film capacitor element. At least a portion of each of the first wiring layer, the second wiring layer, and the counter electrode layer serves as a terminal. Each of the first wiring layer, the second wiring layer, and the counter electrode layer, except the terminal portion, is covered with an insulating coating.

Preferably, the FPC board according to the first aspect of the present invention further includes a first interlayer connector connecting to the counter electrode layer on the back surface of the substrate layer and to the first wiring layer through the substrate layer; a second interlayer connector connecting to the counter electrode layer on the back surface of the substrate layer through the substrate layer; a third interlayer connector connecting to the second wiring layer through the substrate layer; and an element chip on the front surface of the substrate layer, the element chip including a resin mold segment and connectors on the lower surface of the resin mold segment, the connectors connecting to the second interlayer connector and to the third interlayer connector, respectively. The dielectric layer and the counter electrode layer may be sandwiched between the second wiring layer and the substrate layer.

Preferably, the FPC board according to the first aspect of the present invention further includes a first terminal connecting to the second interlayer connector; and a second terminal connecting to the third interlayer connector, the first terminal and the second terminal being provided on the front surface of the substrate layer so as to be separated from each other and to be disposed within edges of the resin mold segment of the element chip to connect to the element chip.

An FPC board according to a second aspect of the present invention includes a substrate layer composed of insulating material; a protection circuit of a thin-film capacitor element, the protection circuit including a first wiring layer on the substrate layer; a dielectric layer on the first wiring layer; and a counter electrode layer on the dielectric layer. At least a portion of each of the first wiring layer and the counter electrode layer serves as a terminal. The front surface of each of the first wiring layer and the counter electrode layer, except the terminal portion, is covered with an insulating coating.

Preferably, the FPC board according to the second aspect of the present invention further includes an element chip including a connector and a resin mold segment. The connector may be connected to the terminal of the first wiring layer. The first wiring layer, the dielectric layer, and the counter electrode layer may be disposed within edges of the resin mold segment. More preferably, the FPC board according to the second aspect of the present invention further includes wiring lines in the first wiring layer, the wiring lines connecting the first wiring layer to other electrical circuits.

The FPC board according to the present invention includes the electrostatic protection circuit built in the substrate layer, on which the wiring layers are disposed. The built-in electrostatic protection circuit is composed of the thin-film capacitor element including a thin-film dielectric layer sandwiched between thin-film conductive layers. Since this FPC board does not need an additional antistatic chip such as a CR element chip, the following advantages can be achieved. The FPC board ensures its flexibility because the FPC board does not include a portion carrying the additional antistatic chip. No additional step for mounting the additional antistatic chip is required, whereas a known FPC board requires an additional step for mounting the antistatic chip preceding a step for mounting, for example, a magnetic head and an optical pickup. No additional space for mounting the additional antistatic chip is required, and a small FPC can be achieved. Moreover, since the electrostatic protection circuit is built in the FPC board in advance, static electricity is less likely to cause electrostatic damage to, for example, a hard disk drive including a magnetic head and a device including an optical pickup in the assembly operation.

In the FPC board according to the present invention, the terminals are disposed under the resin mold segment of the element chip to be mounted on the FPC board to connect to the connectors of the element chip. Since the wiring circuit is entirely covered with the element chip, there is no exposed portion that functions as an antenna erroneously receiving noise as signals. Moreover, since the wiring path between the element chip and the electrostatic protection circuit can be shortened, parasitic inductance can be reduced, thereby maximizing the antistatic effects of the thin-film capacitor element on the discharge of static electricity having a high-frequency component of one gigahertz or more.

DESCRIPTION OF THE PREFERRED EMBODIMENTS

The structure of an FPC board according to the present invention will now be described with reference to the drawings.

Figure 1:
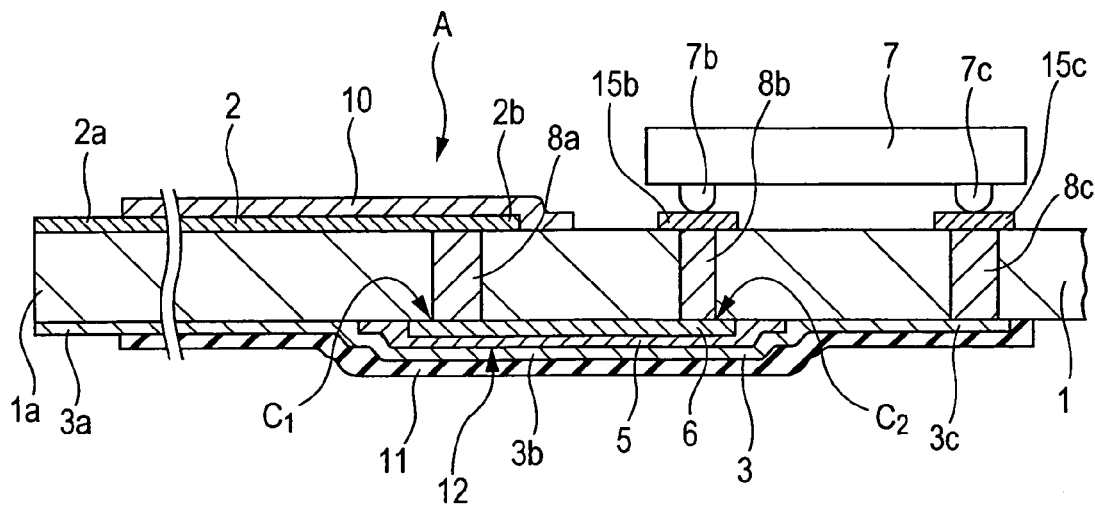
FIG. 1 is a sectional view illustrating a cross-section of a double-layered FPC board according to a first embodiment of the present invention.

FIG. 1 is a sectional view illustrating a cross-section of an FPC board according to a first embodiment of the present invention. An FPC board A according to this embodiment mainly includes a substrate layer 1 composed of insulating material, a first wiring layer 2 that is formed on the upper surface (a first surface) of the substrate layer 1, a second wiring layer 3 that is formed on the lower surface (a second surface) of the substrate layer 1, a dielectric layer 5, and a counter electrode layer 6. The dielectric layer 5 is stacked on the counter electrode layer 6 and is covered with the second wiring layer 3. The FPC board A further includes an element chip 7 that is mounted above the upper surface of the substrate layer 1 and is coupled to a portion of each of these layers, and via-hole connectors 8a, 8b, and 8c (first to third interlayer connectors) that extend through the substrate layer 1 and electrically couple each part to other parts.

The substrate layer 1 is composed of insulating material, for example, polyethylene terephthalate (PET), polyimide, phenolic resin, and polyethylene naphthalate. The substrate layer 1 has a thickness ensuring flexibility (several tens of micrometers to several hundred micrometers) and has, for example, a narrow strip shape. The first wiring layer 2 composed of a conductive thin film of, for example, Cu, is formed on the upper surface of the substrate layer 1 to extend, for example, from a base portion 1a (the left end in FIG. 1) of the substrate layer 1 to the middle of the substrate layer 1 in the longitudinal direction of the substrate layer 1. An insulating coating 10 composed of insulating resin is formed on the first wiring layer 2 except a base portion of the first wiring layer 2. The uncovered base portion of the first wiring layer 2 is a terminal 2a.

The second wiring layer 3 composed of a conductive thin film of, for example, Cu, is formed on the lower surface of the substrate layer 1 to extend, for example, from the base portion 1a (the left end in FIG. 1) of the substrate layer 1 to the middle of the substrate layer 1 in the longitudinal direction of the substrate layer 1. An insulating coating 11 composed of insulating resin is formed on the second wiring layer 3 except a base portion of the second wiring layer 3. The uncovered base portion of the second wiring layer 3 is a terminal 3a.

The counter electrode layer 6 is composed of a conductive thin film of, for example, Cu, and the dielectric layer 5 is composed of a dielectric thin film, both having a rectangular shape as viewed from the top. The counter electrode layer 6 and the dielectric layer 5 are provided on a portion of the lower surface of the substrate layer 1 in this order, the portion being opposite to a tip portion 2b of the first wiring layer 2 on the upper surface of the substrate layer 1. The second wiring layer 3 covers the dielectric layer 5 and extends from the base portion 1a over the right end of the dielectric layer 5 in FIG. 1.

The second wiring layer 3 functions as an electrode layer 3b at a portion that overlaps the dielectric layer 5 and the counter electrode layer 6 and that has the same rectangular shape, as viewed from the top, as the dielectric layer 5 and the counter electrode layer 6. A stacked capacitor 12 (a thin-film capacitor element) is composed of the counter electrode layer 6, the dielectric layer 5, and the electrode layer 3b, these layers forming a metal-insulator-metal structure. Each of the dielectric layer 5 and the counter electrode layer 6 is composed of a thin film having a thickness of several tens of nanometers to several hundred nanometers. Thus, the substrate layer 1 has satisfactory flexibility.

The conductive via-hole connector 8a (the first interlayer connector) extends through the thickness of the substrate layer 1 to connect to the tip portion 2b of the first wiring layer 2 and to a first end of the counter electrode layer 6. The conductive via-hole connector 8b (the second interlayer connector) extends through the thickness of the substrate layer 1 to connect to a terminal connector 15b on the upper surface of the substrate layer 1 and to a second end of the counter electrode layer 6. The conductive via-hole connector 8c (the third interlayer connector) extends through the thickness of the substrate layer 1 to connect to a terminal connector 15c on the upper surface of the substrate layer 1 and to a tip portion 3c of the second wiring layer 3. Connectors 7b and 7c composed of, for example, solder balls, connect to the element chip 7 and to the substrate layer 1. The connectors 7b and 7c are respectively connected to the terminal connectors 15b and 15c. In the arrangement shown in FIG. 1, the connector 7c functions as a ground terminal, and the second wiring layer 3 functions as a ground line.

Figure 2:
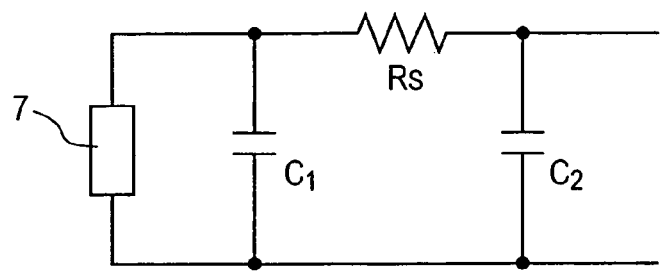
FIG. 2 is an equivalent circuit diagram having components shown in FIG. 1.

As shown in FIG. 1, a first capacitor $C_1$ is composed of the counter electrode layer 6, the dielectric layer 5, and the electrode layer 3b and is connected to the via-hole connector 8a; and a second capacitor $C_2$ is also composed of the counter electrode layer 6, the dielectric layer 5, and the electrode layer 3b and is connected to the via-hole connector 8b. In this arrangement, as shown in FIG. 2, an equivalent circuit including the element chip 7 is formed. In the equivalent circuit, a CR circuit includes the first capacitor $C_1$, the second capacitor $C_2$, and a resistor Rs that is formed across the dielectric layer 5 between the first capacitor $C_1$ and the second capacitor $C_2$, these components being located close to the element chip 7.

The FPC board A having the structure shown in FIG. 1 includes the CR circuit shown in the equivalent circuit of FIG. 2. In this arrangement, when static electricity is built up in the FPC board A in the step of attaching the connectors 7b and 7c, respectively, to the terminal connectors 15b and 15c to mount the element chip 7 on the FPC board A and in any subsequent step, the electric charge is charged to the first capacitor $C_1$ and the second capacitor $C_2$ and has little effect on the element chip 7. Thus, even when the assembly line and steps are not designed specially for preventing static electricity, the FPC board A having the structure shown in FIG. 1 is less likely to cause electrostatic damage to the element chip 7 and cause malfunction of the element chip 7 due to static electricity.

Since no more static electricity protection than necessary is required for the assembly line and steps when the FPC board A has the structure shown in FIG. 1, equipment costs for static electricity protection can be reduced and the assembly process can be simplified.

A conventional FPC board includes an additional antistatic element chip including a CR circuit for static electricity protection. However, the FPC board A does not include the antistatic element chip. Thus, an additional step of mounting the element chip is not required. When an FPC board includes an antistatic element chip, a portion carrying the element chip is rigid and may impair flexibility of the FPC board. In contrast, the FPC board A according to this embodiment having the structure described above has an antistatic feature without impairing high flexibility of the FPC board.

The element chip 7 shown in FIGS. 1 and 2 may be an optical pickup element or a magnetic head including a micro-magnetic circuit, for example, a GMR element. That is, the antistatic FPC board A can be applied to a device including an optical pickup element or a magnetic head.

Furthermore, the element chip 7 is disposed so as to cover the terminal connectors 15b and 15c, as viewed from the top, and only small parts of wiring connectors are not covered by the element chip 7 and are thus exposed. Thus, the exposed parts are less likely to function as an antenna erroneously receiving surrounding noise as signals.

A variety of methods for forming the stacked structure of the FPC board A shown in FIG. 1, including the following methods, can be adopted. For example, the via-hole connectors 8a, 8b, and 8c are formed so as to extend through the thickness of the substrate layer 1, and wiring lines are then formed on the front surface and the back surface of the substrate layer 1. In another example, three resin flexible boards each having a thickness of about one third of the thickness of the substrate layer 1 are prepared; via-holes for connectors are bored through one flexible board; the two other flexible boards are heated to be softened and are stacked on the lower flexible board; via-holes for connectors are bored through the two other flexible boards to form one stacked substrate layer 1 that is composed of three flexible boards and includes via-holes for connectors; and other necessary layers are stacked on the substrate layer 1.

Figure 3:
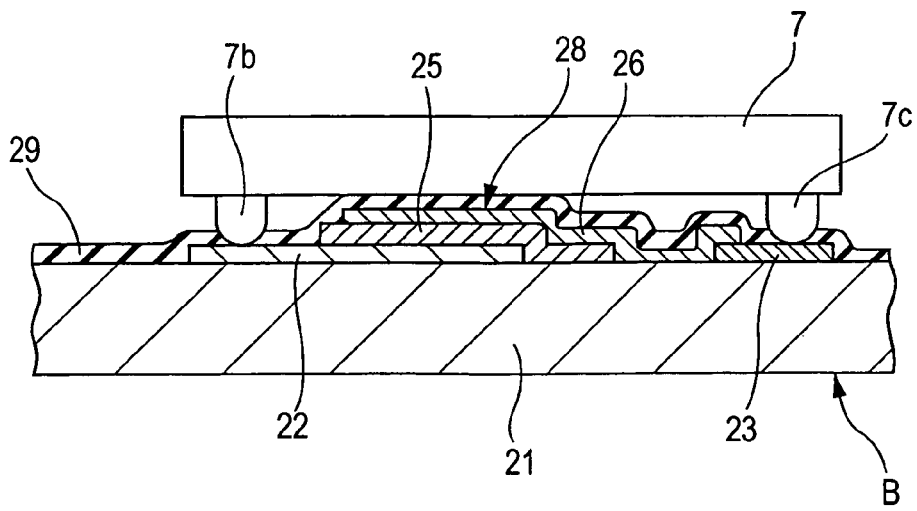
FIG. 3 is a sectional view illustrating a cross-section of a single-layered FPC board according to a second embodiment of the present invention.
Figure 4:
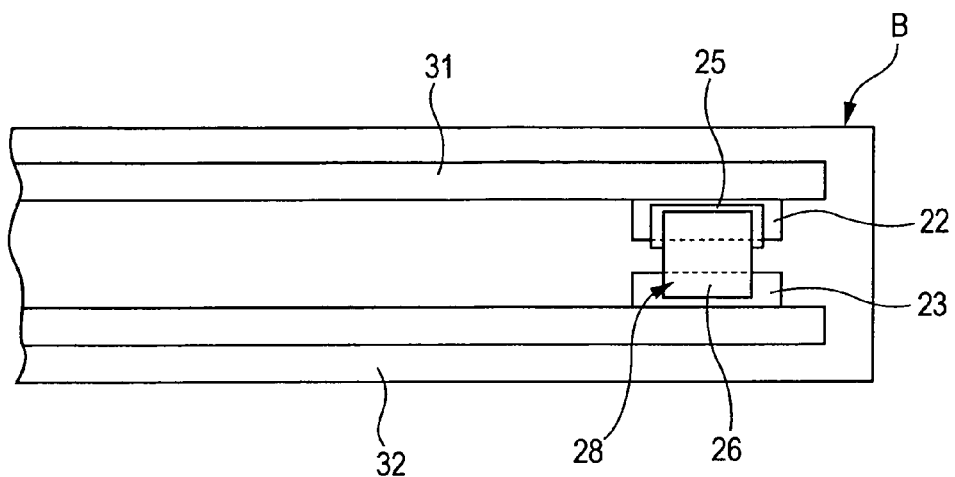
FIG. 4 is a schematic plan view illustrating the structure of an end of the FPC board shown in FIG. 3.

FIG. 3 is a sectional view illustrating a cross-section of an FPC board according to a second embodiment of the present invention. FIG. 4 is a schematic plan view illustrating the structure of an end of the FPC board shown in FIG. 3. An FPC board B according to this embodiment mainly includes a substrate layer 21 that is composed of insulating material and has a narrow strip shape, a first wiring layer 22, a second wiring layer 23, a dielectric layer 25, a counter electrode layer 26, and an element chip 7 that is mounted above the upper surface of the substrate layer 21 and is coupled to a portion of each of these layers. The first wiring layer 22 and the second wiring layer 23 are formed on the upper surface (a first surface) of a first end of the substrate layer 21 so as to be separated from each other. The dielectric layer 25 is stacked on the first wiring layer 22, and the counter electrode layer 26 is stacked on the dielectric layer 25. The element chip 7 is the same as that described above.

The first wiring layer 22 and the second wiring layer 23 are composed of a conductive thin film of, for example, Cu, and have a rectangular shape, as viewed from the top. About half of the dielectric layer 25 is stacked on the first wiring layer 22, and the remaining half of the dielectric layer 25 covers the substrate layer 21. The counter electrode layer 26 covers a large part of the dielectric layer 25, and a portion of the counter electrode layer 26 is connected to the second wiring layer 23. A capacitor 28 (a thin-film capacitor element) is composed a stacked portion of the first wiring layer 22, the dielectric layer 25, and the counter electrode layer 26, these layers forming a metal-insulator-metal structure.

The element chip 7 is disposed above the first wiring layer 22 and the second wiring layer 23. Connectors 7b and 7c composed of, for example, solder balls, connect to the lower surface of the element chip 7. The connectors 7b and 7c are respectively connected to the first wiring layer 22 and the second wiring layer 23. The connector 7b of the element chip 7 functions as a power source, the connector 7c as a ground terminal, and the second wiring layer 23 as a ground line.

As shown in FIG. 4, the first wiring layer 22 extends to a second end of the substrate layer 21 through a first wiring line 31 extending in the longitudinal direction of the substrate layer 21, and the second wiring layer 23 extends to the second end of the substrate layer 21 through a second wiring line 32 extending in the longitudinal direction of the substrate layer 21. An insulating coating 29 is formed so as to partially cover the first wiring layer 22, the second wiring layer 23, the dielectric layer 25, and the counter electrode layer 26.

The FPC board B having the structure shown in FIGS. 3 and 4 includes a CR circuit, as in the equivalent circuit shown in FIG. 2. In this arrangement, when static electricity is built up in the FPC board B in the step of attaching the connectors 7b and 7c, respectively, to the first wiring layer 22 and the second wiring layer 23 to mount the element chip 7 on the FPC board B and in any subsequent step, the electric charge is charged to the capacitor 28 and has little effect on the element chip 7.

Thus, even when the assembly line and steps are not designed specially for preventing static electricity, the FPC board B having the structure shown in FIGS. 3 and 4 is less likely to cause electrostatic damage to the element chip 7 and cause malfunction of the element chip 7 due to static electricity.

Since no more static electricity protection than necessary is required for the assembly line and steps when the FPC board B has the structure shown in FIGS. 3 and 4, equipment costs for static electricity protection can be reduced and the assembly process can be simplified.

A conventional FPC board includes an additional antistatic element chip including a CR circuit for static electricity protection. However, the FPC board B does not include the antistatic element chip. Thus, an additional step of mounting the element chip is not required. When an FPC board includes an antistatic element chip, a portion carrying the element chip is rigid and may impair flexibility of the FPC board. In contrast, the FPC board B according to this embodiment having the structure described above has an antistatic feature without impairing high flexibility of the FPC board. The element chip 7 shown in FIG. 3 may be an optical pickup element or a magnetic head. That is, the antistatic FPC board B can be applied to a device including an optical pickup element or a magnetic head, as in the first embodiment.

Furthermore, the element chip 7 is disposed so as to cover the connectors 7b and 7c, as viewed from the top, and only small parts of wiring lines are not covered by the element chip 7 and are thus exposed. Thus, the exposed parts are less likely to function as an antenna erroneously receiving surrounding noise as signals.

Figure 5:
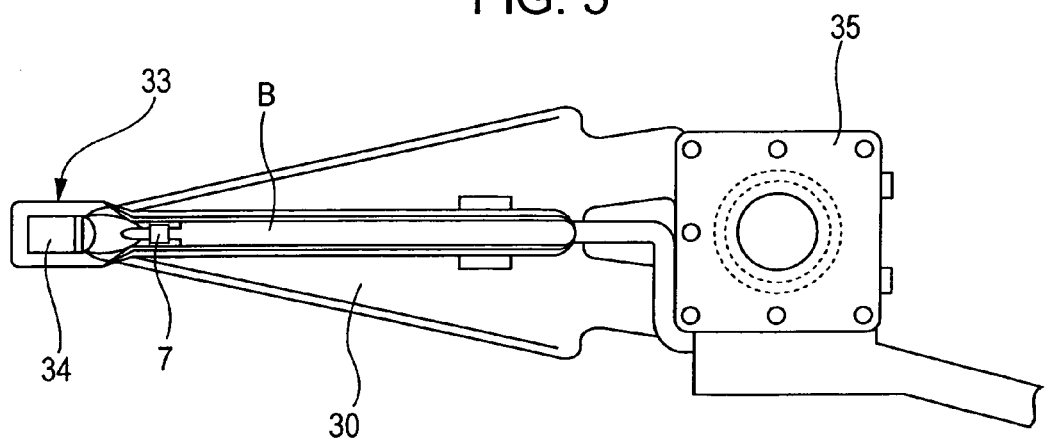
FIG. 5 is a plan view illustrating the structure of a magnetic head device according to a third embodiment including the FPC board according to the second embodiment.

FIG. 5 illustrates an outline structure of a magnetic head device according to a third embodiment including the FPC board B according to the second embodiment.

In the third embodiment, a magnetic head 34, including a micro-magnetic circuit, for example, a GMR element, is attached to a slider 33 mounted on a tip of a load beam 30 that is composed of a metal plate having a tapered shape, as viewed from the top. The FPC board B is disposed so as to extend in the longitudinal direction of the load beam 30 to electrically connect to the micro-magnetic circuit. A rectangular mounting plate 35 is attached to the base of the load beam 30. The mounting plate 35 is then attached to a drive mechanism in a hard disk drive, and the load beam 30 moves relative to a magnetic disk (not shown in the drawing).

In this embodiment, an element chip 7 attached to the FPC board B is disposed close to the magnetic head 34 in the neighborhood of the tip of the load beam 30 and is protected from static electricity. The element chip 7 may include an amplifying circuit that amplifies detection signals from the magnetic head 34. Thus, the amplifying circuit disposed close to the magnetic head 34 is protected from static electricity.

EXAMPLE

Under the condition that a laser diode (LD) element serving as an optical pickup device is used in place of the element chip 7 in the circuit shown in FIG. 2, electrostatic breakdown voltages of the LD element were examined at several capacitances, including zero, of thin-film capacitor elements. Examination was carried out using the charged device model (CDM). The resistance R was 35 Ω. A red laser diode mainly composed of a GaAs substrate was used as the LD element. Table I shows the results of the examination.

TABLE I

| Capacitance of Capacitors $C_1$ and $C_2$ (unit: µF) | Breakdown Voltage (unit: KV) |
| --- | --- |
| 1.0 | 1.4 |
| 0.5 | 1.4 |
| 0.1 | 1.4 |
| 0.02 | 1.4 |
| 0.01 | 1.4 |
| 0 | 0.5 |

Apparently, the results indicated in Table I show that the electrostatic breakdown voltages of the optical pickup device were improved when the capacitors $C_1$ and $C_2$ were charged. While the first wiring layer 22 and the second wiring layer 23, which generally have a thickness of about 25 µm in the second embodiment, ensure flexibility of the FPC board, the capacitors $C_1$ and $C_2$ having capacitances shown in Table I can be formed with a dielectric layer having a thickness of 30 nm and an electrode layer having a thickness of 2 µm. That is, the FPC board having wiring lines can include built-in antistatic components without impairing its flexibility.

Thus, for example, even when an FPC board is connected to a magnetic head and quickly moves along with the moving magnetic head, the FPC board being deformed, an antistatic FPC board can be achieved without impairing the flexibility of the FPC board.

What is claimed is:

1. A flexible printed circuit (FPC) board comprising:
   a substrate layer composed of insulating material;
   a first wiring layer on the front surface of the substrate layer;
   a second wiring layer on the back surface of the substrate layer;
   at least one dielectric layer;
   at least one counter electrode layer;
   a first interlayer connector connecting to the counter electrode layer on the back surface of the substrate layer and to the first wiring layer through the substrate layer;
   a second interlayer connector connecting to the counter electrode layer on the back surface of the substrate layer through the substrate layer;
   a third interlayer connector connecting to the second wiring layer through the substrate layer; and
   an element chip on the front surface of the substrate layer, the element chip including a resin mold segment and connectors on the lower surface of the resin mold segment, the connectors connecting to the second interlayer connector and to the third interlayer connector, respectively,
   wherein
      a stack of a dielectric layer, a counter electrode layer, and the first wiring layer, and/or a stack of a dielectric layer, a counter electrode layer, and the second wiring layer defines a protection circuit of a thin-film capacitor element,
      at least a portion of each of the first wiring layer, the second wiring layer, and the counter electrode layer serves as a terminal,
      each of the first wiring layer, the second wiring layer, and the counter electrode layer, except the terminal portion, is covered with an insulating coating, and
   wherein
      the dielectric layer and the counter electrode layer are sandwiched between the second wiring layer and the substrate layer.

2. The FPC board according to claim 1, further comprising:
   a first terminal connecting to the second interlayer connector; and a second terminal connecting to the third interlayer connector, the first terminal and the second terminal being provided on the front surface of the substrate layer so as to be separated from each other and to be disposed within edges of the resin mold segment of the element chip to connect to the element chip.

3. An FPC board comprising:
   a substrate layer composed of insulating material;
   a protection circuit of a thin-film capacitor element, the protection circuit including
      a first wiring layer on the substrate layer;
      a dielectric layer on the first wiring layer; and
      a counter electrode layer on the dielectric layer; and
   an element chip including a connector and a resin mold segment,
   wherein
      at least a portion of each of the first wiring layer and the counter electrode layer serves as a terminal,
      the front surface of each of the first wiring layer and the counter electrode layer, except the terminal portion, is covered with an insulating coating, and
   wherein
      the connector is connected to the terminal of the first wiring layer; and
      the first wiring layer, the dielectric layer, and the counter electrode layer are disposed within edges of the resin mold segment.

4. The FPC board according to claim 3, further comprising:
   wiring lines in the first wiring layer, the wiring lines connecting the first wiring layer to other electrical circuits.

* * * * *